(12) United States Patent
Zhou et al.

(10) Patent No.: US 10,111,336 B1
(45) Date of Patent: Oct. 23, 2018

(54) METHOD OF MAKING A FLEXIBLE PRINTED CIRCUIT BOARD

(71) Applicants: FuKui Precision Component (Shenzhen) Co., Ltd., Shenzhen (CN); HongQiSheng Precision Electronics (QinHuangDao) Co., Ltd., Qinhuangdao (CN)

(72) Inventors: Lei Zhou, Shenzhen (CN); Rui-Wu Liu, Shenzhen (CN); Qiong Zhou, Shenzhen (CN)

(73) Assignees: Avary Holding (Shenzhen) Co., Limited., Shenzhen (CN); HongQiSheng Precision Electronics (QinHuangDao) Co, Qinhuangdao (CN)

( * ) Notice: Subject to any disclaimer, the term of this patent is extended or adjusted under 35 U.S.C. 154(b) by 0 days.

(21) Appl. No.: 15/609,131

(22) Filed: May 31, 2017

(30) Foreign Application Priority Data

Apr. 19, 2017 (CN) .......................... 2017 1 0256783

(51) Int. Cl.
| | |
|---|---|
| H05K 3/02 | (2006.01) |
| H05K 3/10 | (2006.01) |
| H05K 1/18 | (2006.01) |
| H05K 1/09 | (2006.01) |
| H05K 3/06 | (2006.01) |
| H05K 3/18 | (2006.01) |
| H05K 1/03 | (2006.01) |

(52) U.S. Cl.
CPC ............ *H05K 1/189* (2013.01); *H05K 1/032* (2013.01); *H05K 1/09* (2013.01); *H05K 3/064* (2013.01); *H05K 3/188* (2013.01); *H05K 2203/0723* (2013.01); *Y10T 29/49155* (2015.01)

(58) Field of Classification Search
CPC .......... H05K 1/189; H05K 1/032; H05K 1/09; H05K 3/188; H05K 3/062; H05K 3/064; H05K 2203/0723; Y10T 29/49126; Y10T 29/49155
USPC ........................... 29/830, 846; 205/123, 125
See application file for complete search history.

(56) References Cited

U.S. PATENT DOCUMENTS

| | | | | |
|---|---|---|---|---|
| 4,866,008 A | * | 9/1989 | Brighton | ........... H01L 21/76885 205/123 |
| 6,398,935 B1 | * | 6/2002 | Downes | ................... C25D 7/12 205/125 |
| 6,517,893 B2 | * | 2/2003 | Abys | ...................... H05K 3/062 29/846 |

* cited by examiner

*Primary Examiner* — Donghai D Nguyen
(74) *Attorney, Agent, or Firm* — ScienBiziP, P.C.

(57) ABSTRACT

A flexible printed circuit board with reduced ion migration from signal-carrying elements which are coated against corrosion includes an insulating layer, a wiring area, a copper electroplating layer, a nickel electroplating layer, a cover film, and a gold chemical-plating layer. The wiring area is formed on the insulating layer. The copper electroplating layer formed on the wiring area has a first portion and a second portion. The nickel electroplating layer is formed on at least the first portion and exposes sidewalls of the first portion. The cover film is formed on the second portion and fills in gaps of the copper electroplating layer. The gold chemical-plating layer is formed on top surface of the nickel electroplating layer and the sidewalls of the first portion.

8 Claims, 9 Drawing Sheets

METHOD OF MAKING A FLEXIBLE PRINTED CIRCUIT BOARD

FIELD

The subject matter herein generally relates to circuit boards, and particularly, to a flexible printed circuit board (FPCB) and a method for making the FPCB.

BACKGROUND

FPCBs are widely used in various kinds of electronic devices. The FPCB usually comprises a copper wiring layer. A surface of the copper wiring layer is usually treated by chemical plating of nickel and gold to form a nickel chemical-plating layer and a gold chemical-plating layer, thereby increase corrosion resistance of the FPCB.

However, when the copper wiring layer has a minimal line space, the line space may further decrease due to existence of the nickel chemical-plating layer, which may increase the risk of ion migration from the copper wiring layer.

BRIEF DESCRIPTION OF THE DRAWINGS

Implementations of the present technology will now be described, by way of example only, with reference to the attached figures.

DETAILED DESCRIPTION

Figure 1:
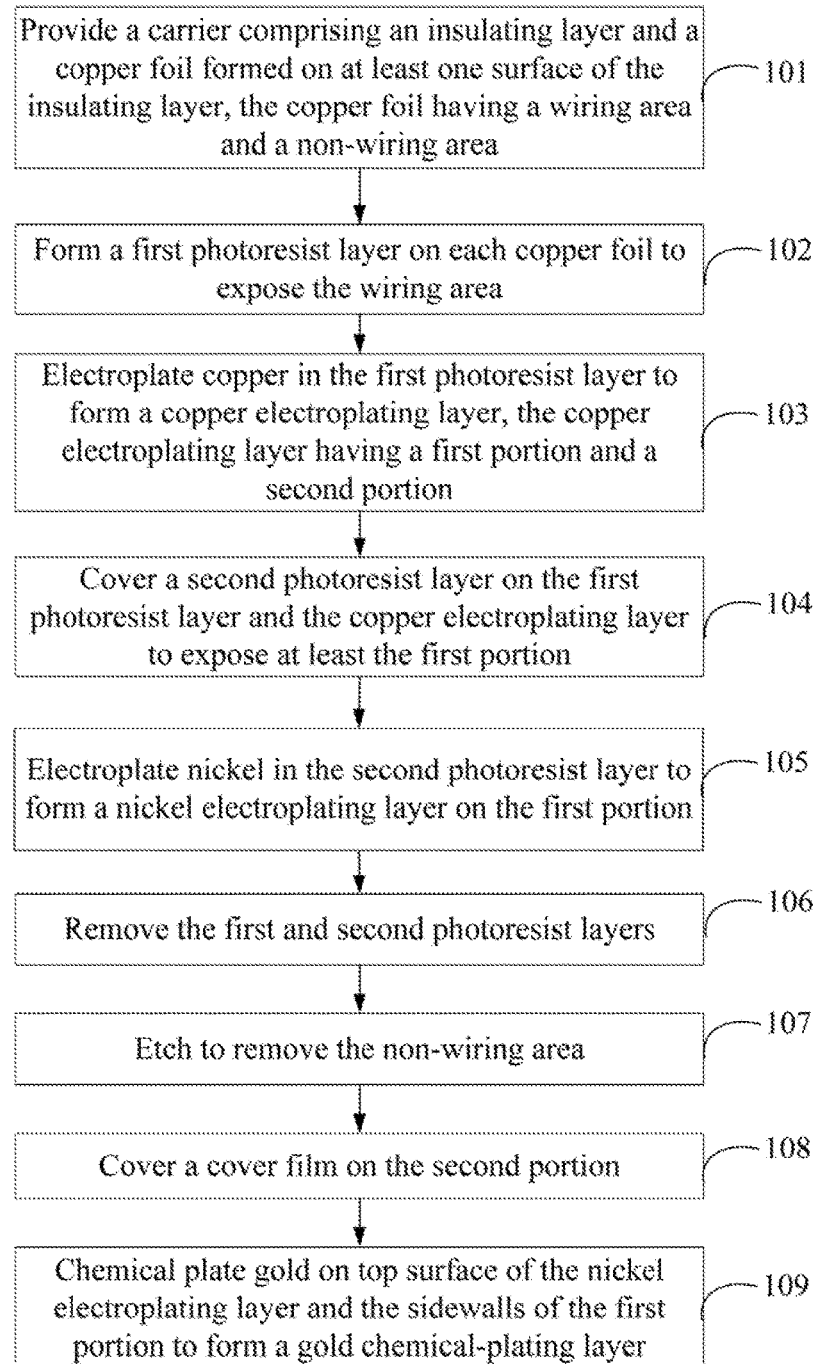
FIG. 1 is a flowchart of an exemplary embodiment of a method for making an FPCB.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

The term "comprising," when utilized, means "including, but not necessarily limited to"; it specifically indicates open-ended inclusion or membership in the so-described combination, group, series, and the like.

Referring to FIGS. 1-10, a method for making an FPCB 100 (shown in FIG. 10) is presented in accordance with a first exemplary embodiment. The method for making the FPCB 100 is provided by way of example, as there are a variety of ways to carry out the method. The exemplary method can begin at step 101.

Figure 2:
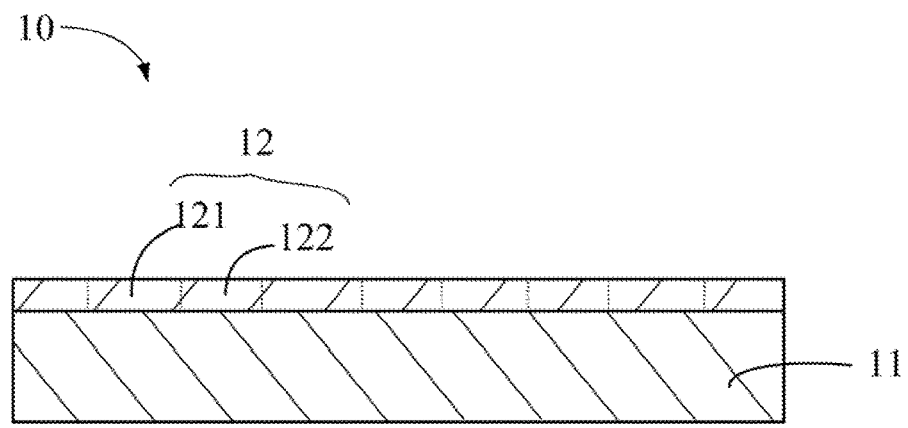
FIG. 2 is a diagram of a carrier used in the method of FIG. 1.

At step 101, referring to FIG. 2, a carrier 10 is provided, which comprises an insulating layer 11 and a copper foil 12 formed on at least one surface of the insulating layer 11 (FIG. 1 shows only one copper foil 12). The copper foil 12 comprises a wiring area 121 and a non-wiring area 122 besides the wiring area 121.

In at least one exemplary embodiment, the insulating layer 11 is made of a polymer selected from a group consisting of polyimide, polytetrafluoroethylene, poly thiamine, poly (methyl methacrylate), polycarbonate, polyethylene terephthalate, and polyimide-polyethyleneterephthalate, and any combination thereof. In at least one exemplary embodiment, the insulating layer 11 has a thickness of about 10 μm.

Figure 3:
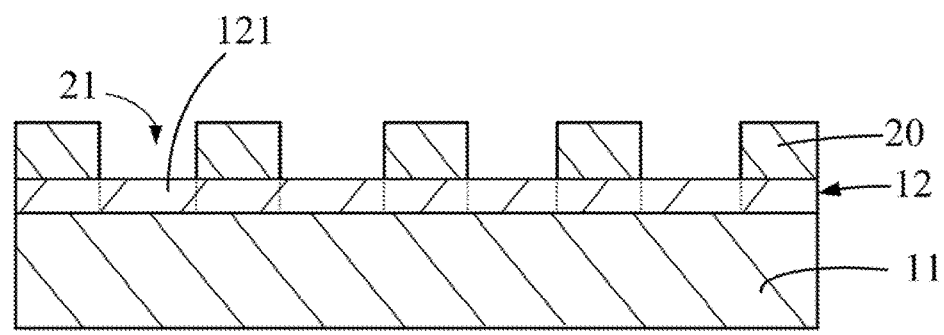
FIG. 3 is a diagram showing a first photoresist layer being formed on the carrier of FIG. 2.

At step 102, referring to FIG. 3, a first photoresist layer 20 is formed on the copper foil 12. The first photoresist layer 20 has a first hollow pattern 21 to expose the wiring area 121 of the copper foil 12.

In at least one exemplary embodiment, the first photoresist layer 20 is treated by an exposure and development process to form the first hollow pattern 21. The first photoresist layer 20 can be a dry film.

Figure 4:
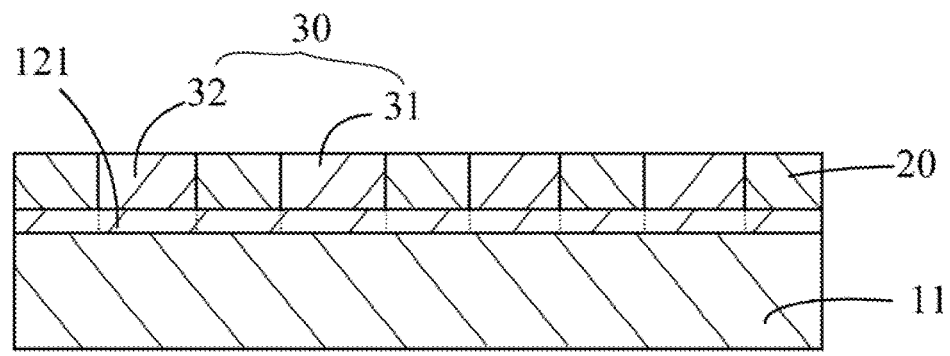
FIG. 4 is a diagram of a copper electroplating layer formed by electroplating of copper in the first photoresist layer of FIG. 3.

At step 103, referring to FIG. 4, the first hollow pattern 21 is electroplated with copper, thereby forming a copper electroplating layer 30 on the wiring area 121. The copper electroplating layer 30 comprises a first portion 31 that awaits nickel electroplating and a second portion 32 besides the first portion 31.

In at least one exemplary embodiment, the copper electroplating layer 30 has a thickness of about 25 μm.

Figure 5:
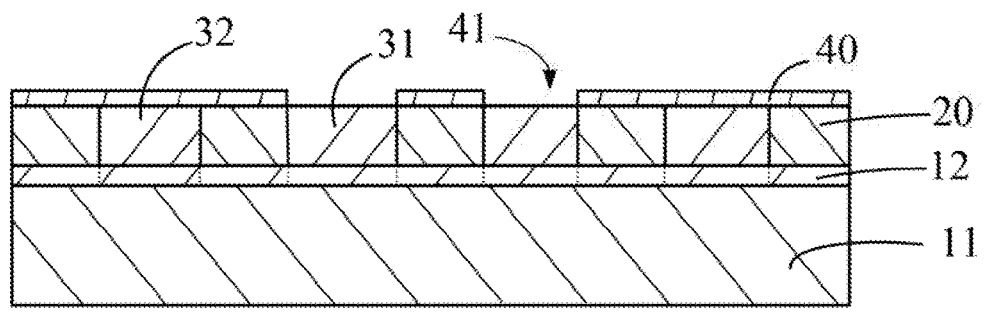
FIG. 5 is a diagram showing a second photoresist layer being formed on the first photoresist layer and the copper electroplating layer of FIG. 4.

At step 104, referring to FIG. 5, a second photoresist layer 40 is formed on and covered on the first photoresist layer 20 and the copper electroplating layer 30. The second photoresist layer 40 has a second hollow pattern 41 to expose at least the first portion 31 of the copper electroplating layer 30.

In at least one exemplary embodiment, the second photoresist layer 40 covers only the first portion 31.

In at least one exemplary embodiment, the second photoresist layer 40 is treated by an exposure and development process to form the second hollow pattern 41. The second photoresist layer 40 can also be a dry film.

Figure 6:
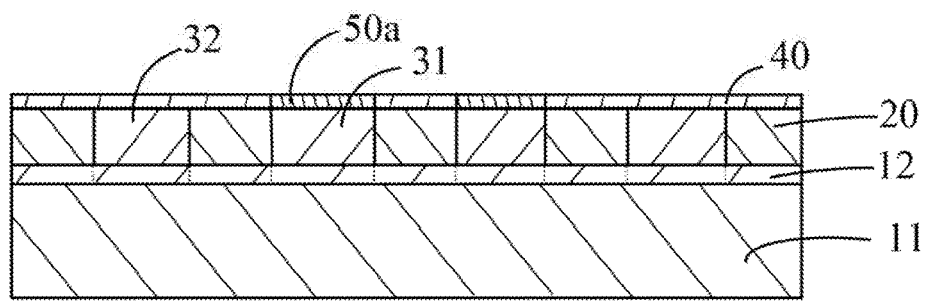
FIG. 6 is a diagram of a nickel electroplating layer formed by electroplating nickel in the second photoresist layer of FIG. 5.

At step 105, referring to FIG. 6, the second hollow pattern 41 is electroplated with nickel, thereby forming a nickel electroplating layer 50a at least on the first portion 31.

In at least one exemplary embodiment, the nickel electroplating layer 50a has a thickness of about 2 μm to about 6 μm.

Figure 7:
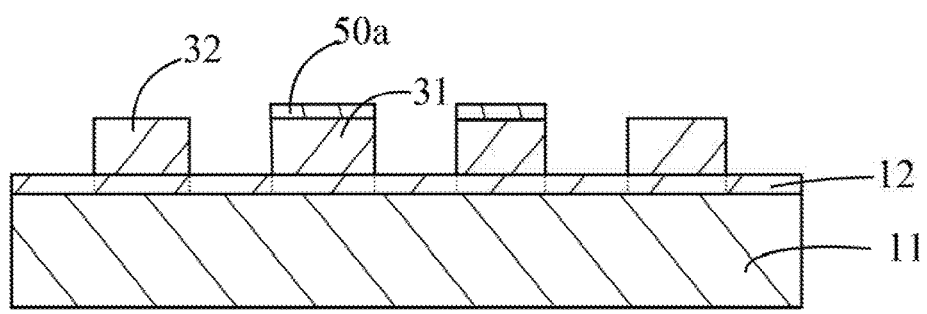
FIG. 7 is a diagram showing the first and the second photoresist layers of FIG. 6 removed.

At step 106, referring to FIG. 7, the first photoresist layer 20 and the second photoresist layer 40 are removed.

Figure 8:
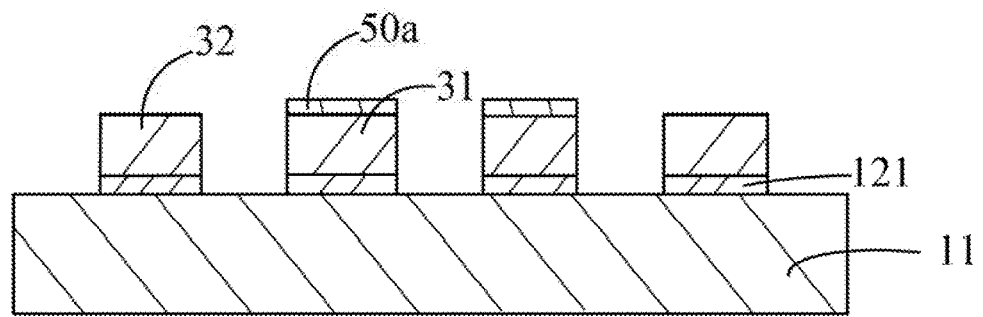
FIG. 8 is a diagram showing a non-wiring area of the carrier of FIG. 7 etched and removed.

At step 107, referring to FIG. 8, the non-wiring area 122 of the copper foil 12 is etched and removed so that the wiring area 121 forms a desired circuit wiring.

Figure 9:
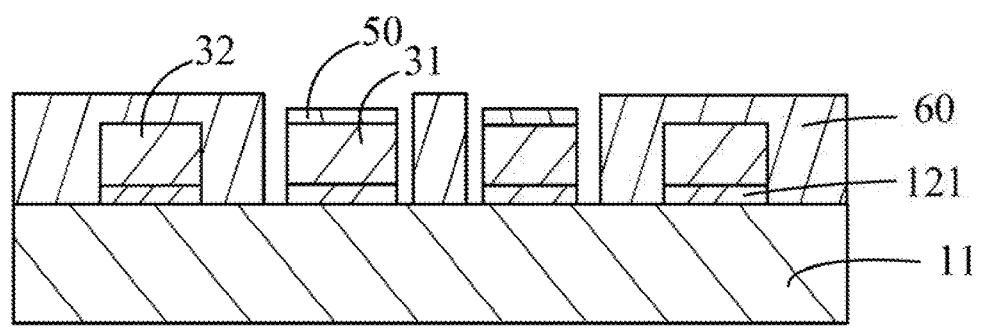
FIG. 9 is a diagram showing a cover film being formed on the copper electroplating layer of FIG. 8.

At step 108, referring to FIG. 9, a cover film 60 is covered on the second portion 32 of the copper electroplating layer 30, thereby causing the cover film 60 to fill in gaps of the copper electroplating layer 30 and the cover film 60 to be spaced from sidewalls of the first portion 31.

In at least one exemplary embodiment, the cover film 60 is a solder mask layer.

Figure 10:
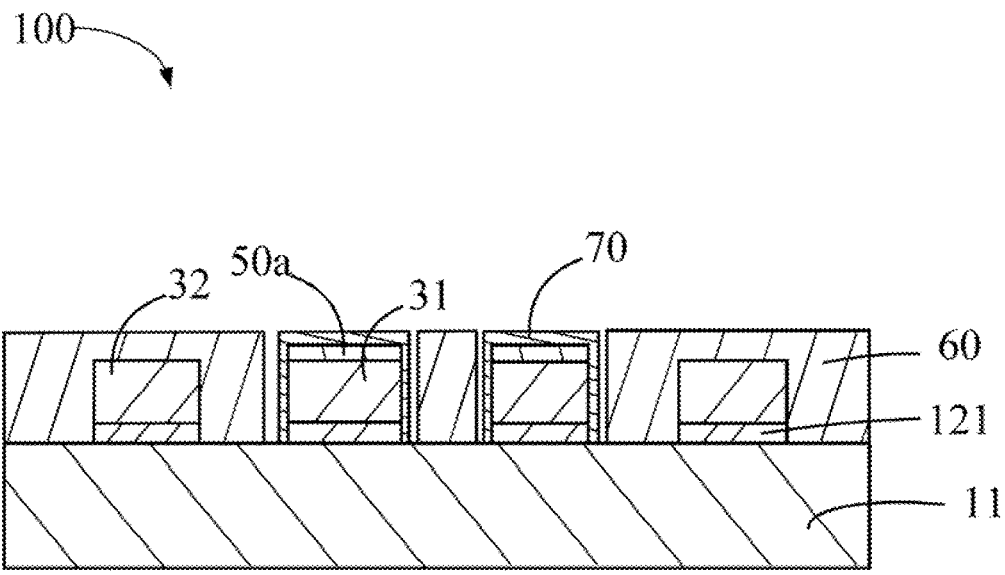
FIG. 10 is a diagram of an exemplary embodiment of an FPCB formed by chemical plating gold on the nickel electroplating layer of FIG. 9.

At step 109, referring to FIG. 10, a top surface of the nickel electroplating layer 50a facing away from the first portion 31 and the sidewalls of the first portion 31 are chemical plated with gold to form a gold chemical-plating layer 70, thereby forming the FPCB 100.

Figure 11:
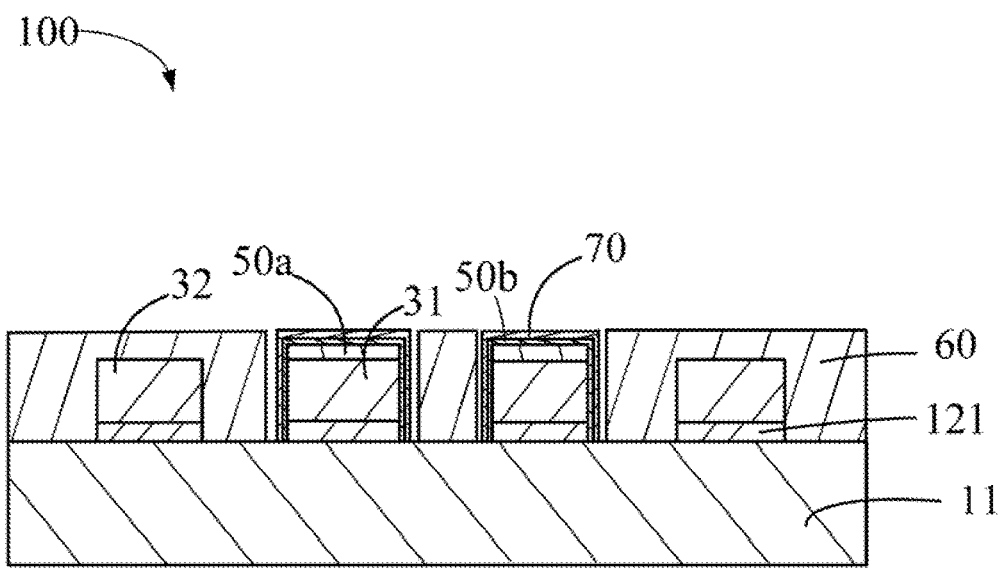
FIG. 11 is a diagram of another exemplary embodiment of an FPCB formed by chemical plating nickel and gold on the nickel electroplating layer of FIG. 9.

FIG. 11 illustrates in another exemplary embodiment, before forming the gold chemical-plating layer 70, the top surface of the nickel electroplating layer 50a facing away from the first portion 31 and the sidewalls of the first portion 31 are chemical plated with nickel to form a nickel chemical-plating layer 50b. Then, the gold chemical-plating layer 70 is formed on a top surface of the nickel chemical-plating layer 50b facing away from the first portion 31 and sidewalls of the nickel chemical-plating layer 50b. In this exemplary embodiment, the sum of thicknesses of the nickel electroplating layer 50a and the top surface of the nickel chemical-plating layer 50b is about 2 μm to about 6 μm. The sidewall of the nickel chemical-plating layer 50b has a thickness of about 0.2 μm to about 2 μm.

Figure 12:
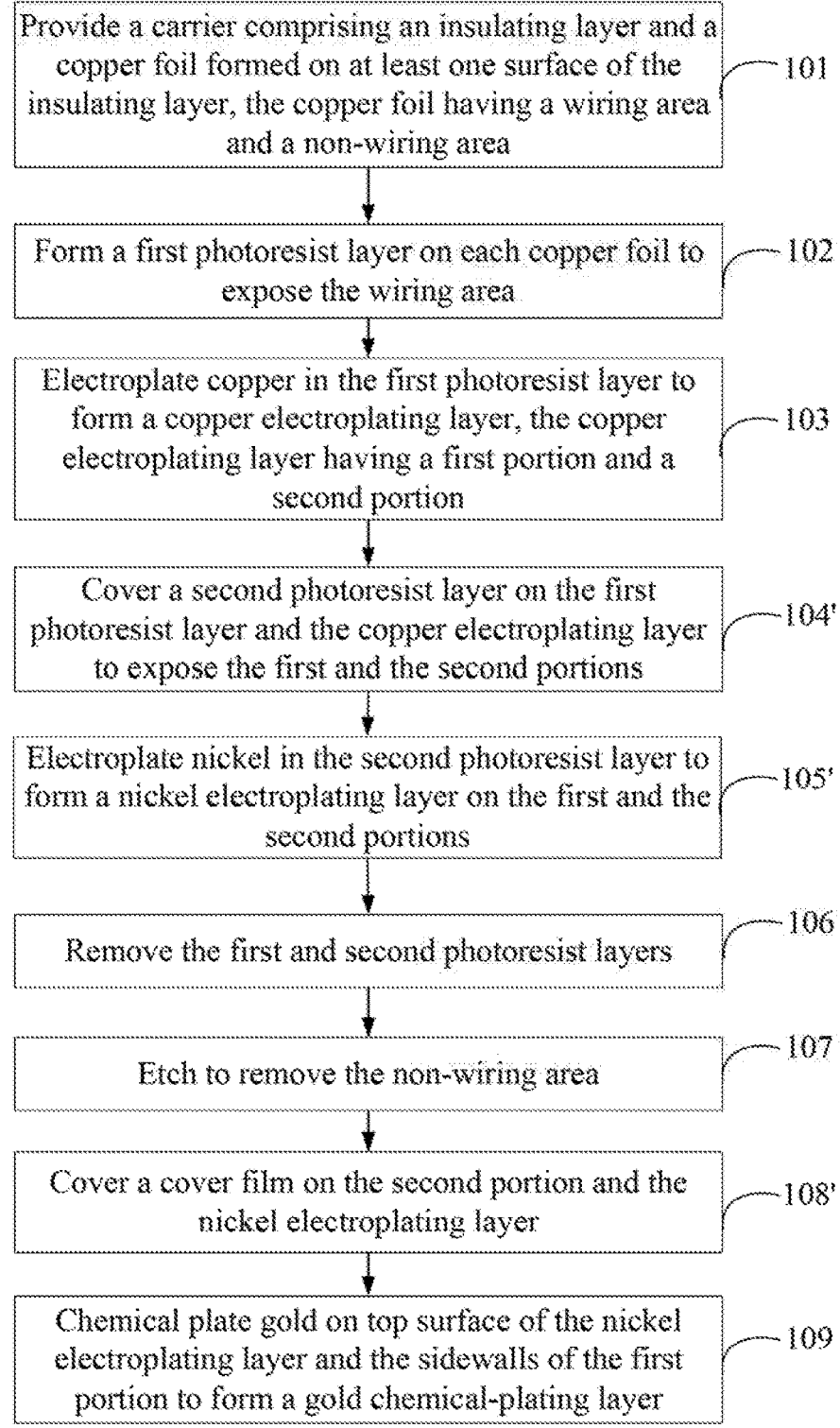
FIG. 12 is a flowchart of another exemplary embodiment of the method for making an FPCB.
Figure 13:
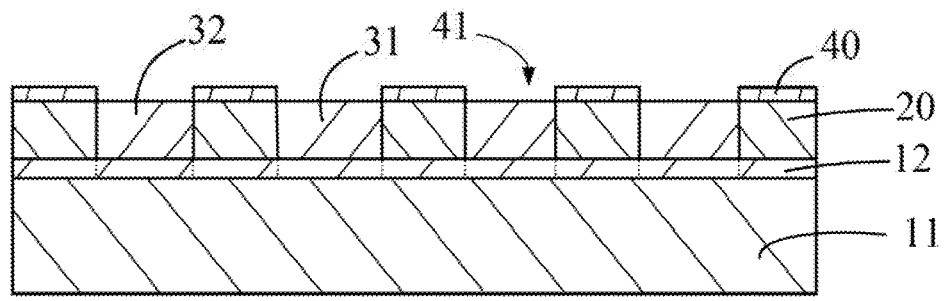
FIG. 13 is a diagram showing a second photoresist layer formed on the first photoresist layer and the copper electroplating layer in the method of FIG. 12.

Referring to FIG. 12, a second exemplary method for making an FPCB 100' is further provided. Differences from the above first exemplary embodiment are:

At step 104', referring to FIG. 13, a second photoresist layer 40 is applied on the first photoresist layer 20 and the copper electroplating layer 30. The second photoresist layer exposes both the first portion 31 and the second portion 32 of the copper electroplating layer 30.

Figure 14:
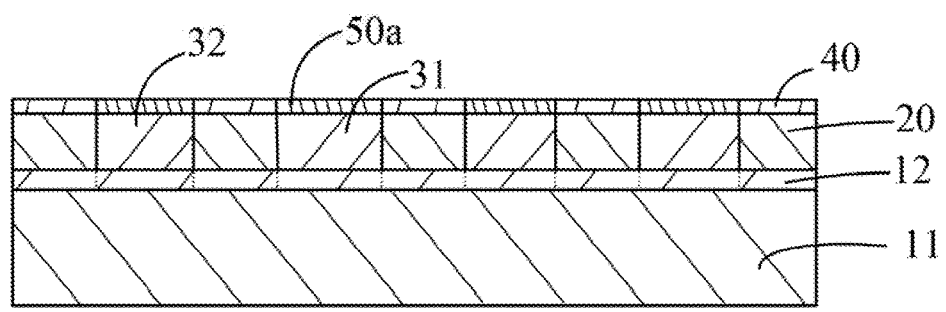
FIG. 14 is a diagram of a nickel electroplating layer formed by electroplating nickel in the second photoresist layer of FIG. 13.

At step 105', referring to FIG. 14, the second hollow pattern 41 is electroplated with nickel, thereby forming a nickel electroplating layer 50a both on the first portion 31 and the second portion 32.

Figure 15:
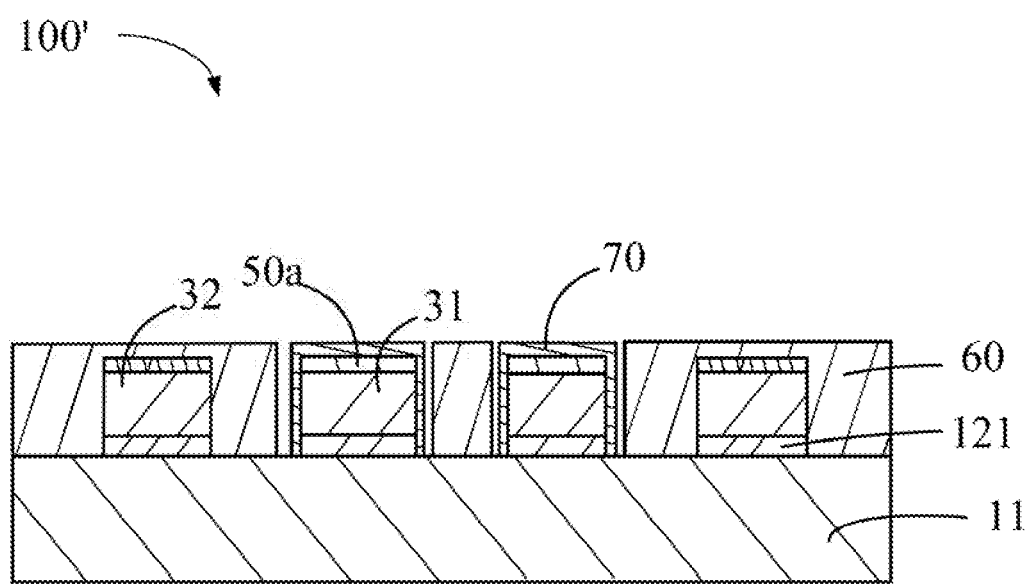
FIG. 15 is a diagram showing the first and the second photoresist layers of FIG. 14 removed, non-wiring area of the carrier etched, a cover film covering the copper electroplating layer, and a gold chemical-plating layer formed on the nickel electroplating layer, to form yet another exemplary embodiment of an FPCB.

Thus, at step 108', referring to FIG. 15, the cover film 60 covers the second portion 32 of the copper electroplating layer 30 and the nickel electroplating layer 50a formed on the second portion 32.

Depending on the exemplary embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

FIGS. 10 and 11 illustrate that in the first exemplary embodiment, an FPCB 100 comprises an insulating layer 11 and a wiring area 121 formed on at least one surface of the insulating layer 11. A copper electroplating layer 30 is formed on and corresponds to the wiring area 121. The copper electroplating layer 30 comprises a first portion 31 and a second portion 32 besides the first portion 31. A nickel electroplating layer 50a is formed on a top surface of at least the first portion 31 facing away from the wiring area 121. The nickel electroplating layer 50a exposes sidewalls of the first portion 31. A cover film 60 is formed on the second portion 32 and fills in gaps of the copper electroplating layer 30.

In at least one exemplary embodiment, the nickel electroplating layer 50a is only formed on the top of the first portion 31.

Referring to FIG. 10, in at least one exemplary embodiment, a gold chemical-plating layer 70 is formed on a top surface of the nickel electroplating layer 50a facing away from the first portion 31 and the sidewalls of the first portion 31.

Referring to FIG. 11, in at least one exemplary embodiment, a nickel chemical-plating layer 50b is formed on a top surface of the nickel electroplating layer 50a facing away from the first portion 31 and the sidewalls of the first portion 31. The gold chemical-plating layer 70 is formed on a top surface of the nickel chemical-plating layer 50b facing away from the first portion 31 and sidewalls of the nickel chemical-plating layer 50b.

FIG. 15 illustrates a second exemplary embodiment of an FPCB 100'. Differences from the first exemplary embodiment are that the nickel electroplating layer 50a is formed on a top surface of both the first portion 31 and the second portion 32 facing away from the wiring area 121. The nickel electroplating layer 50a exposes sidewalls of the first portion 31 and the second portion 32.

With the above configuration, the nickel electroplating layer 50a is not formed on the sidewalls of the first portion 31, thereby preventing the line space of the copper electroplating layer 30 from being reduced by the nickel electroplating layer 50a. Thus, a risk of ion migration from the copper electroplating layer 30 is reduced. Even when the nickel chemical-plating layer 50b is formed on the top surface of the nickel electroplating layer 50a facing away from the first portion 31 and the sidewalls of the first portion 31, a very small thickness of the nickel chemical-plating layer 50b can prevent ion migration from the copper electroplating layer 30, thereby preventing the line space of the copper electroplating layer 30 from being greatly reduced.

Moreover, the nickel electroplating layer 50a can function as a catalytic agent in the process of chemical-electroplating of nickel. Thus, during the process of chemical-electroplating of nickel and gold, the copper electroplating layer 30 does not need to be activated by palladium substitution. That is, palladium residue within the nickel electroplating layer 50a is avoided, which further reduces the risk of ion migration.

Even though information and advantages of the present embodiments have been set forth in the foregoing description, together with details of the structures and functions of the present embodiments, the disclosure is illustrative only.

Changes may be made in detail, especially in matters of shape, size, and arrangement of parts within the principles of the present embodiments to the full extent indicated by the plain meaning of the terms in which the appended claims are expressed.

What is claimed is:

1. A method for making a flexible printed circuit board comprising:

providing a carrier comprising an insulating layer and a copper foil formed on at least one surface of the insulating layer, the copper foil having a wiring area and a non-wiring area besides the wiring area;

forming a first photoresist layer on the copper foil, the first photoresist layer having a first hollow pattern to expose the wiring area;

electroplating copper in the first hollow pattern, thereby forming a copper electroplating layer on the wiring area, the copper electroplating layer having a first portion and a second portion besides the first portion;

forming and covering a second photoresist layer on the first photoresist layer and the copper electroplating layer, the second photoresist layer having a second hollow pattern to expose at least the first portion, the second hollow pattern totally aligned with the first hollow pattern having the copper electroplating layer formed therein;

electroplating nickel in the second hollow pattern, thereby forming a nickel electroplating layer at least on the first portion;

removing the first photoresist layer and the second photoresist layer;

etching to remove the non-wiring area;

covering a cover film on the second portion, the cover film filling in gaps of the copper electroplating layer and being spaced from sidewalls of the first portion; and chemically plating gold on a top surface of the nickel electroplating layer facing away from the first portion and the sidewalls of the first portion to form a gold chemical-plating layer, thereby forming the flexible printed circuit board.

2. The method of claim 1, wherein the nickel electroplating layer has a thickness of about 2 μm to 6 μm.

3. The method of claim 1, wherein before forming the gold chemical-plating layer, the method further comprises:

chemical plating nickel on the top surface of the nickel electroplating layer facing away from the first portion and the sidewalls of the first portion to form a nickel chemical-plating layer.

4. The method of claim 3, wherein a sum of thicknesses of the nickel electroplating layer and the top surface of the nickel chemical-plating layer is of about 2 μm to 6 μm, and the sidewall of the nickel chemical-plating layer has a thickness of about 0.2 μm to 2 μm.

5. The method of claim 1, wherein the second photoresist layer exposes both the first portion and the second portion, so that the nickel electroplating layer is formed on both the first portion and the second portion.

6. The method of claim 1, wherein the insulating layer is made of a polymer selected from a group consisting of polyimide, polytetrafluoroethylene, poly thiamine, poly (methyl methacrylate), polycarbonate, polyethylene terephthalate, and polyimide-polyethyleneterephthalate, and any combination thereof.

7. The method of claim 1, wherein the first photoresist layer and the second photoresist layers are dry films.

8. The method of claim 1, wherein the cover film is a solder mask layer.

* * * * *

UNITED STATES PATENT AND TRADEMARK OFFICE
CERTIFICATE OF CORRECTION

Page 1 of 1

PATENT NO. : 10,111,336 B1
APPLICATION NO. : 15/609131
DATED : October 23, 2018
INVENTOR(S) : Lei Zhou, Rui-Wu Liu and Qiong Zhou It is certified that error appears in the above-identified patent and that said Letters Patent is hereby corrected as shown below:

On the Title Page

Please replace Item (73) regarding "Assignees" with the following:
(73) Assignees: Avary Holding (Shenzhen) Co., Limited, Shenzhen (CN);
HongQiSheng Precision Electronics (QinHuangDao) Co.,Ltd., Qinhuangdao (CN)

Signed and Sealed this
Twenty-first Day of July, 2020

Andrei Iancu
*Director of the United States Patent and Trademark Office*